(12) United States Patent
Tanabe

(10) Patent No.: US 7,816,716 B2
(45) Date of Patent: Oct. 19, 2010

(54) SEMICONDUCTOR FERROELECTRIC DEVICE, MANUFACTURING METHOD FOR THE SAME, AND ELECTRONIC DEVICE

(75) Inventor: Hiroshi Tanabe, Tokyo (JP)

(73) Assignee: NEC Corporation, Tokyo (JP)

( * ) Notice: Subject to any disclaimer, the term of this patent is extended or adjusted under 35 U.S.C. 154(b) by 1112 days.

(21) Appl. No.: 11/159,097

(22) Filed: Jun. 23, 2005

(65) Prior Publication Data

US 2006/0051910 A1  Mar. 9, 2006

(30) Foreign Application Priority Data

Jun. 24, 2004  (JP) ............................. 2004-187036

(51) Int. Cl.
*H01L 21/70* (2006.01)
*H01L 27/115* (2006.01)

(52) U.S. Cl. ..................... 257/295; 257/411; 257/412; 257/298; 438/240; 438/393; 438/396; 438/785

(58) Field of Classification Search ................. 257/72, 257/411, 412, 295, 298, 213, E21.009, E21.209, 257/E21.272, E21.664; 438/240, 393, 396, 438/785
See application file for complete search history.

(56) References Cited

U.S. PATENT DOCUMENTS

2001/0019130 A1* 9/2001 Yamazaki et al. ............. 257/72

2001/0040249 A1* 11/2001 Jung ........................... 257/295
2002/0021544 A1*  2/2002 Cho et al. .................... 361/200
2002/0024621 A1*  2/2002 Hirakata et al. ............... 349/34
2007/0111519 A1*  5/2007 Lubomirsky et al. ........ 438/678

FOREIGN PATENT DOCUMENTS

| JP | 4-85878 | 3/1992 |
|----|---------|--------|
| JP | 9-116159 | 5/1997 |
| JP | 10-242471 | 9/1998 |
| JP | 2002-334970 | 11/2002 |

* cited by examiner

*Primary Examiner*—Zandra Smith
*Assistant Examiner*—Tsz K Chiu
(74) *Attorney, Agent, or Firm*—McGinn IP Law Group, PLLC

(57) ABSTRACT

Source/drain diffusion layers and a channel region are formed in a polysilicon thin film formed on a substrate made of glass or the like, and furthermore, a gate electrode 6 is formed via a gate insulating film. A silicon hydronitride film is formed on the interlayer dielectric film, whereby the hydrogen concentration in an active element region including a switching thin film transistor can be maintained at a high level, and Si—H bonds in the silicon thin film become stable. In addition, by providing a ferroelectric film on the silicon hydronitride film via a lower electrode formed of a conductive oxide film, whereby the oxygen concentration of the ferroelectric capacitive element layer can be maintained at a high level, and generation of oxygen deficiency in the ferroelectric film is prevented.

27 Claims, 9 Drawing Sheets

SEMICONDUCTOR FERROELECTRIC DEVICE, MANUFACTURING METHOD FOR THE SAME, AND ELECTRONIC DEVICE

BACKGROUND OF THE INVENTION

1. Technical Field of the Invention

The present invention relates to a semiconductor device having a dielectric capacitor, a manufacturing method for the same, and an electronic device using the same, and more specifically to a semiconductor device in which a dielectric capacitor is driven by an active element formed on an insulating substrate, a manufacturing method for the same, and an electronic device using the same.

2. Description of the Related Art

Recently, semiconductor devices for memories such as a nonvolatile memory (ferroelectric memory) using ferroelectric materials and a dynamic random access memory (DRAM) using high-dielectric materials have been actively studied, and a number of products of these have been supplied onto the market. Semiconductor devices of these ferroelectric memories and DRAMs have a switching transistor, a capacitor is connected to one diffusion layer (source region or drain region) of this switching transistor to form a memory cell, and charges are accumulated in this capacitor, whereby data is stored.

As a ferroelectric capacitor to be used as a ferroelectric memory uses ferroelectric materials such as PZT ($PbZr_xTi_{1-x}O_3$), PLZT ($Pb_{1-y}La_yZr_xTi_{1-x}O_3$), and SBT ($SrBi_2Ta_2O_9$) as a capacitance insulating film, and by polarizing the ferroelectric materials, nonvolatile data can be stored. On the other hand, a high-dielectric capacitor to be used as a DRAM uses a high-dielectric thin film of BST ($Ba_xSr_{1-x}TiO$) as a capacitance insulating film, and effective film thickness reduction has been promoted in accordance with required capacity increases.

For example, prior art 1 (Japanese Published Unexamined Patent Application No. 2002-334970) discloses a semiconductor device having a switching transistor and a capacitor. FIG. 13 is a sectional view of such a conventional semiconductor device. As shown in FIG. 13, in this semiconductor device, an MOS (Metal Oxide Semiconductor) type switching transistor 119 is provided on the surface of a silicon single crystal substrate 101, and a dielectric capacitor 118 is provided above this switching transistor 119 via interlayer dielectric films 105, 108, and 111. The source or drain of the switching transistor 119 is connected to a lower electrode 113 of the dielectric capacitor 118 by a multilayer metal interconnection structure including interconnections 107 and 110.

In the switching transistor 119, two diffusion layers 103 that serve as a source and a drain are formed on the surface of a silicon single crystal substrate 101 sectioned by oxide films 102, and above the channel region between the diffusion layers 103, a gate electrode 104 is formed via a gate insulating film 120. An interlayer dielectric film 105 is formed so as to cover this switching transistor 109, and metal interconnections 107 are formed thereon. The metal interconnections 107 are electrically connected to the two diffusion layers 103 of the switching transistor 119 by plugs 106. The metal interconnection 107 connected to one diffusion layer 103 is used as an interconnection for connecting the dielectric capacitor 118 and the switching transistor 119. The metal interconnection 107 connected to the other diffusion layer 103 is used as a bit line.

An interlayer dielectric film 108 is formed so as to cover the interlayer dielectric film 105 and the interconnection 107, and a metal interconnection 110 is formed thereon. Furthermore, an interlayer dielectric film 111 is formed so as to cover the interlayer dielectric film 108 and the interconnection 110, and on this interlayer dielectric film 111, a dielectric capacitor 118 is provided. In this dielectric capacitor 118, a lower electrode 113, a dielectric thin film 114, and an upper electrode 115 are laminated in order. The lower electrode 113 is electrically connected to the interconnection 110 via a via hole 112.

Furthermore, an interlayer dielectric film 116 is formed so as to cover the dielectric capacitor 118 and the interlayer dielectric film 111, and on this interlayer dielectric film 116, a metal interconnection 117 is provided. This metal interconnection 117 is provided so as to fill up a contact hole formed in the interlayer dielectric film 116, and is electrically connected to the upper electrode 115. The metal interconnection 117 is used as a plate interconnection.

In these lower electrode 113 and upper electrode 115, in order to prevent deterioration of intrinsic polarization of the dielectric thin film 114 due to deficiency of oxygen, a metal having a low affinity with oxygen such as Pt, Pd, Ir, Rh, Os, Au, Ag, or Ru, or a conductive oxide film of $PtO_x$, $PdO_x$, $IrO_x$, $RhO_x$, $OsO_x$, $AuO_x$, $AgO_x$, or $RuO_x$ is used. At the interface between the lower electrode 113 and the via hole 112, in order to prevent relative reaction and relative diffusion of Pt or the like of the lower electrode 113 and W or the like of the via hole 112, a barrier layer (not shown) made of a conductive nitride film of TiN or the like is formed.

The dielectric thin film 114 is a ferroelectric thin film of $BaTiO_3$, $PbTiO_3$, PZT, PLZT, SBT, or the like or a high-dielectric thin film of BST etc. The dielectric thin film of these is formed on the lower electrode by means of sputtering, a sol-gel method, or a CVD (Chemical Vapor Deposition) method, and is crystallized into a perovskite-like structure by annealing at a predetermined temperature. The ferroelectric thin film thus formed has a polycrystalline structure. In this annealing, according to prior art 2 (Japanese Published Unexamined Patent Application No. H04-85878), it is preferable that heating is carried out in the atmosphere containing oxygen at 600° C., and one hour of annealing is necessary. In prior art 1, it is mentioned that the CVD method is used for film formation, crystallization is carried out by heating in the atmosphere of hydrogen to 300 to 500° C., and the surface of the film can be flattened by irradiation with an excimer laser.

In such a conventional semiconductor device, the structure below the lower electrode 113 of the memory cell is the same as that of an LSI (Large Scale Integrated Circuit) that has no capacitor. Therefore, this can be manufactured by a normal LSI manufacturing process by using an existing logic circuit.

However, as described above, this conventional semiconductor nonvolatile storage device is manufactured by the same LSI manufacturing process as that for a general existing logic circuit, so that the manufacturing costs are comparatively high although the storage capacity is comparatively easily increased.

On the other hand, it is expected that not only computers but also various electronic devices including televisions and other home electric appliances will be connected to the Internet in accordance with the advent of a ubiquitous society. Accordingly, the number of addresses of electronic devices on Internet (IP addresses) will be rapidly increase due to introduction of the Internet protocol IPv6. The increase in the number of IP addresses will lead to an increase in temporary (the period of use is much shorter than that of conventional electronic devices) or disposable electronic (recognition and storage) devices such as IC tags (wireless ID tags and radio-frequency ID tags, etc.) and IC cards. Most of these electronic devices have no power source, so that nonvolatile semiconductor devices using the above-described ferroelectric thin films or high-dielectric thin films are used for recognition and storage of data. In such temporary or disposable electronic devices, manufacturing of a semiconductor device having a proper storage capacity at very low cost is demanded more than realization of large capacity. However, it is difficult to meet this demand by the above-described conventional semiconductor devices.

On the other hand, as a transistor that is manufactured at low cost and replaced with the conventional switching transistor manufactured by the LSI manufacturing process, a thin film transistor is available in which a semiconductor layer is formed on an inexpensive substrate such as a low melting point substrate containing no alkali metal (alkali-free) and used as an active layer. As this thin film transistor, one using amorphous silicon or polysilicon (polycrystalline silicon) hydride as an active layer has been made practicable, however, in a nonvolatile semiconductor device, a polysilicon thin film having higher carrier mobility and higher drive performance has been used. In a thin film transistor using this polysilicon thin film, for example, as disclosed in prior art 3 (Japanese Published Unexamined Patent Application No. H09-116159) and prior art 4 (Japanese Published Unexamined Patent Application No. H10-242471), a polysilicon thin film serving as a source/drain and a channel is formed on an insulating substrate, a gate insulating film and a gate electrode are formed on this polysilicon thin film, and hydrogen plasma processing is applied, whereby the polysilicon thin film is activated by hydrogen passivation.

On the other hand, it is desirable that a semiconductor storage device is used together with a higher-function semiconductor device having an operation function. Conventionally, by forming a high-function element such as a CPU formed by the LSI process on a single crystal silicon substrate and a memory element into one chip, the packaging cost was reduced. Furthermore, for the memory element, the design rules were made more detailed and the memory capacity to be formed per unit area was increased, and as a result, the costs were reduced.

On the other hand, the polysilicon thin film of the thin film transistor is formed by, for example, the CVD method, and this CVD film contains many Si dangling bonds that do not rarely exist in a silicon single crystal substrate. Si dangling bonds are dangling bonds with Si—Si bonds cut, and are bonded to contaminant atoms and deteriorate the semiconductor performance. Therefore, it is necessary to eliminate such Si dangling bonds.

Therefore, for example, in prior art 3, Si dangling bonds are bonded to hydrogen by applying hydrogen plasma processing to a polysilicon film that serves as a source/drain region and a channel region formed on an insulating substrate to form Si—H bonds, whereby the dangling bonds are electrically inactivated.

However, the above-described conventional techniques have the following problems. When a switching transistor is formed by using the technique of prior art 2 and a dielectric capacitor is formed thereon, Si—H bonds are thermally unstable, and due to the heating process when forming a ferroelectric oxide film to be used for the dielectric capacitor, the Si—H bonds are cut and Si dangling bonds are generated again.

In addition, due to action of hydrogen contained in the polysilicon film as a reductant, oxygen deficiency occurs in the ferroelectric oxide film to be used for the dielectric capacitor, and this may result in lowering of the non-dielectric constant and an increase in leak current.

SUMMARY OF THE INVENTION

An object of the present invention is to provide a semiconductor device which has stable Si—H bonds in its switching transistor region and does not cause oxygen deficiency in the ferroelectric oxide film of the dielectric capacitor region, a manufacturing method for the same, and an electronic device using the same.

A semiconductor device according to a first aspect of the present invention comprises an insulating substrate; an active element formed in an active element layer disposed above this insulating substrate; a ferroelectric capacitive element formed in a ferroelectric capacitive element layer disposed above the active element layer; and a silicon hydronitride layer formed between the active element layer and the ferroelectric capacitive element layer, wherein the active element includes a thin film transistor having a polysilicon thin film having source/drain regions and a channel region, a gate electrode formed above the channel region, and a gate insulating film formed between the polysilicon thin film and the gate electrode, the active element layer has an interlayer dielectric film which covers the polysilicon thin film and includes the gate electrode embedded, the ferroelectric capacitive element is formed by laminating a lower electrode, a ferroelectric layer, and an upper electrode, and the hydrogen concentration of the active element layer is higher than the hydrogen concentration of the ferroelectric capacitive element.

In the present invention, the active element layer is composed of an active element having a thin film transistor, and an interlayer dielectric film that covers the polysilicon thin film of the thin film transistor and includes a gate electrode embedded therein. The ferroelectric capacitive element layer is composed of a ferroelectric capacitive element, and in some cases, a protective film is formed so as to cover this ferroelectric capacitive element.

A semiconductor device according to a second aspect of the present invention comprises an insulating substrate; an active element formed in an active element layer disposed above the insulating substrate; a ferroelectric capacitive element formed in a ferroelectric capacitive element layer disposed above the active element layer; a silicon hydronitride layer formed between the active element layer and the ferroelectric capacitive element layer; and a conductive oxide layer formed between this silicon hydronitride layer and the ferroelectric capacitive element, wherein the active element includes a thin film transistor having a polysilicon thin film that has source/drain regions and a channel region, a gate electrode formed above the channel region, and a gate insulating film formed between the polysilicon thin film and the gate electrode, and the active element layer has an interlayer dielectric film that covers the polysilicon thin film and includes the gate electrode embedded therein, the ferroelectric capacitive element is a laminate of a lower electrode, a ferroelectric layer, and an upper electrode, and the hydrogen concentration of the active element layer is higher than that of the ferroelectric capacitive element layer, and the oxygen concentration of the ferroelectric capacitive element layer is higher than that of the active element layer.

In this case, a connecting part that connects the active element and the ferroelectric capacitive element by being inserted through the silicon hydronitride layer can be provided. The lower electrode can be formed from a conductive oxide. The conductive oxide is, for example, indium tin oxide. It is preferable that the silicon hydronitride layer is formed by means of plasma CVD (Chemical Vapor Deposition).

The connecting part has, for example, an interconnection formed in the silicon hydronitride layer, a first via hole that penetrates the silicon hydronitride layer and connects the lower electrode and the interconnection, and a second via hole that penetrates the interlayer dielectric film and connects the source/drain regions and the interconnection. It is also possible that the connecting part includes an interconnection formed in the silicon hydronitride layer, a first via hole that penetrates the silicon hydronitride layer and connects the upper electrode and the interconnection, and a second via hole that penetrates the interlayer dielectric film and connects the source/drain regions and the interconnection. In this case, the ferroelectric film is formed on the silicon hydronitride layer so as to cover the lower electrode, and the first via hole can be formed so as to be inserted through an opening formed in the ferroelectric film.

The semiconductor device is, for example, a nonvolatile memory in which the active element is used as a switching element, and the ferroelectric capacitive element is used as a capacitive part.

A manufacturing method for a semiconductor device according to a third aspect of the present invention comprises the steps of: forming a thin film transistor by forming a polysilicon thin film on an insulating substrate, forming a gate electrode via a gate insulating film, and forming source/drain regions and a channel region by ion implantation in the polysilicon thin film by using the gate electrode as a mask; forming an interconnection layer on an interlayer dielectric film covering this thin film transistor and forming a first contact to be connected to the thin film transistor through the interlayer dielectric film, forming a silicon hydronitride film on the interlayer dielectric film so as to cover the interconnection layer; forming a lower electrode on this silicon hydronitride film and forming a second contact to be connected to the interconnection layer through the silicon hydronitride film; forming a ferroelectric layer on the lower electrode; and forming an upper electrode on the ferroelectric layer.

A manufacturing method for a semiconductor device according to a fourth aspect of the present invention comprises the steps of: forming a thin film transistor by forming a polysilicon thin film on an insulating substrate, forming a gate electrode via a gate insulating film, and forming source/drain regions and a channel region by ion implantation in the polysilicon thin film by using the gate electrode as a mask; forming an interconnection layer on the interlayer dielectric film covering this thin film transistor and forming a first contact to be connected to the thin film transistor through the interlayer dielectric film; forming a silicon hydronitride film on the interlayer dielectric film so as to cover the interconnection layer; forming a lower electrode on this silicon hydronitride film; forming a ferroelectric layer on the lower electrode; and forming an upper electrode on the ferroelectric layer and forming a second contact to be connected to the interconnection layer through the silicon hydronitride film.

In these manufacturing methods for semiconductor devices, the silicon hydronitride film is preferably formed by plasma CVD (vapor growth). In addition, in the steps after the step of forming the silicon hydronitride layer, it is preferable that the temperature of the polysilicon thin film does not become higher than 350° C.

An electronic device according to a fifth aspect of the present invention uses the semiconductor device according to any one of claims 1 through 11.

The electronic device is, for example, an IC card using a nonvolatile memory described in claim 11 of the present invention. The nonvolatile memory can be formed integrally on the same substrate together with a central processing unit (CPU), a radio-frequency (RF) interface that transmits and receives data to and from the exterior, and a read-only memory (ROM) for storing data, or the central processing unit (CPU), the radio-frequency (RF) interface for transmitting and receiving data to and from the exterior, and a read-only memory (ROM) for storing data can be formed on a single crystal silicon substrate separately from the nonvolatile memory.

The electronic device is a radio-frequency IC tag having, for example, a nonvolatile memory according to claim 11, and further having a transmission data encoder element, a received data decoder element, an antenna element for data exchange with the exterior, and a control element for controlling these elements. In this case, the transmission data encoder element, the received data decoder element, and the control element can be formed on a single crystal semiconductor substrate.

The electronic device is, for example, a liquid crystal display unit, and in this liquid crystal display unit, a pixel circuit of the liquid crystal display unit is formed on the insulating substrate of the semiconductor device according to claim 5, a pixel electrode connected to a transistor of this pixel circuit is formed on a silicon hydronitride layer that is the same layer as the silicon hydronitride layer of the semiconductor device, and is an indium tin oxide film that is the same layer as the indium tin oxide layer forming the lower electrode of the semiconductor device.

According to the present invention, a silicon hydronitride layer is formed on a polysilicon thin film formed on an insulating substrate, whereby the hydrogen concentration of an active element layer including a thin film transistor such as a switching transistor can be maintained at a high level, and Si—H bonds become stable. Namely, silicon dangling bonds of the thin film transistor of the active element layer below the silicon hydronitride layer can be terminated by hydrogen, oxygen and moisture can be prevented from entering from above the substrate, and the operations of the thin film transistor become stable. In addition, as in the case of claim 2, by providing a ferroelectric capacitive element on a silicon hydronitride layer via a conductive oxide film, or as in the case of claim 4, by forming a lower electrode from a conductive oxide, a conductive oxide exists between the silicon hydronitride layer and the ferroelectric layer, so that diffusion of hydrogen atoms retained in the silicon hydronitride layer formed by plasma CVD into the ferroelectric layer, that is, oxygen deficiency caused by hydrogen as a reductant can be prevented, whereby problems caused by oxygen deficiency can be prevented.

DETAILED DESCRIPTION OF THE PREFFERED EMBODIMENTS

Figure 1:
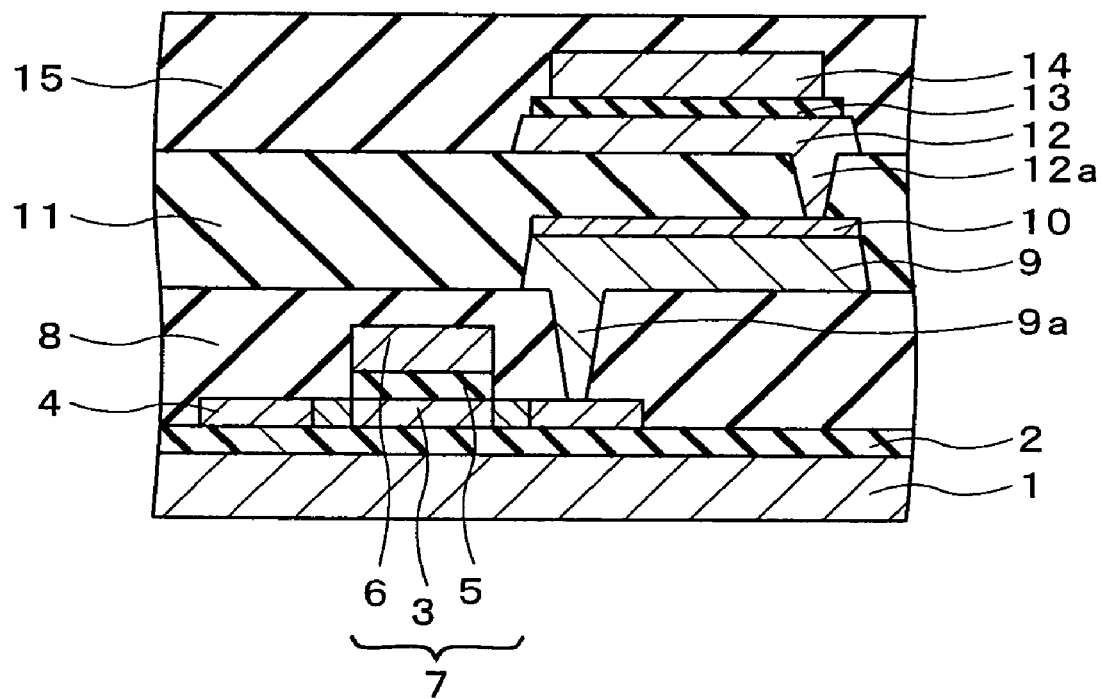
FIG. 1 is a sectional view showing a semiconductor device according to a first embodiment of the present invention.

Hereinafter, embodiments of the present invention are described in detail with reference to the accompanying drawings. FIG. 1 is a sectional view showing a semiconductor device according to a first embodiment. On the substrate 1, a protective oxide film 2 is formed. The thickness of the substrate 1 is, for example, 0.1 to 1.5 mm. The substrate 1 is made of, for example, glass with a smaller content of alkali metals, quartz, a plastic material such as polycarbonate, polyimide, or the like. The protective oxide film 2 prevents impurities contained in the substrate 1 from diffusing in layers higher than the protective oxide film 2, and when the substrate 1 is made of high-quality quartz, the protective oxide film 2 is not necessary. However, in the case where the substrate 1 is made of glass containing metal impurities or plastic containing organic impurities, a proper material is selected for the protective oxide film 2 according to the substrate material. For example, when non-alkali glass (OA-10 made by Nippon Electric Glass Co., Ltd.) is used as the substrate 1, an oxide film with a film thickness of approximately 300 nm is used as the protective oxide film 2.

On the protective oxide film 2, a thin film transistor 7 as a switching transistor is provided. In the thin film transistor 7, a polysilicon thin film is formed on the protective oxide film 2, and a gate electrode 6 is pattern-formed on this polysilicon thin film via a gate insulating film 5. In the polysilicon thin film, by implanting impurity ions of phosphorus or boron, etc., by using the gate electrode 6 as a mask, source/drain diffusion layers 4 are formed, and in the region between the diffusion layers 4 below the gate electrode 6, a channel region 3 is formed. In the source/drain diffusion layers 4, a low concentration region on the channel region 3 side and a high concentration region outside the low concentration region are formed by forming a mask and controlling the impurity implanting amount, whereby a so-called LDD (Lightly Doped Drain) structure can be provided. One of the diffusion layers 4 is a source region and the other one is a drain region, which are disposed opposite each other by sandwiching the channel region 3.

An amorphous silicon layer (a-Si: H layer) is formed into, for example, a 50-nm thickness, annealed to remove hydrogen atoms, and then irradiated with an excimer laser, whereby the polysilicon thin film (diffusion layers 4 and the channel region 3) is made polycrystal. By setting the intensity of the excimer laser irradiation to 300 to 450 mJ/cm$^2$, a polycrystalline silicon thin film with an average grain size of 20 nm to 2 μm is obtained. The larger the average grain size, the higher the driving performance of the thin film transistor, however, this results in an increase in fluctuations of transistor performance within the substrate, so that the average grain size is preferably 200 nm. The channel length is, for example, 1 micrometer, and in this case, when the average grain size is 200 nm, its ratio to the channel length is sufficiently small as ⅕, whereby variation in transistor performance caused by the crystal grain size difference can be minimized.

The gate insulating film 5 can be formed on an island formed of a polysilicon thin film by means of plasma CVD. This gate insulating film 5 can be formed by plasma CVD. For example, by making the substrate temperature reach 370° C. in oxygen-mixed plasma by using tetraethoxysilane (TEOS) as a source gas, a gate insulating film formed of a silicon oxide film with a thickness of, for example, 50 nm is formed.

On the gate insulating film 5, a gate electrode 6 is formed. This gate electrode 6 is a laminate of, for example, a phosphorus-doped polysilicon film and chromium film, and the thicknesses of the polysilicon film and the chromium film are, for example, 100 nm and 200 nm, respectively. Namely, for example, a poly (polycrystal) silicon film gas-doped with phosphorus is deposited by plasma CVD to a thickness of 100 nm, and continuously, a Cr film is deposited to 200 nm by sputtering. Thereafter, the polycrystal silicon and Cr laminated film is patterned by photolithography and etching to form a gate electrode and a gate wiring. In this process, the channel length (gate length) of the thin film transistor is determined.

Impurities of phosphorus or boron, etc., are doped into the polysilicon thin film in a self-aligning manner by using the gate as a mask. In this case, it is a circuit design choice which of CMOS, PMOS or NMOS construction is to be employed, however, if the performance of operation speed and power consumption is satisfied, PMOS/NMOS is better for reducing manufacturing costs.

After forming the thin film transistor 7, an interlayer dielectric film 8 is formed on the entire surface. The interlayer dielectric film 8 is, for example, a silicon oxide film, which can be formed by plasma CVD, and the film thickness thereof is, for example, 400 nm. This interlayer dielectric film 8 can be deposited in oxygen-mixed plasma by using tetraethoxysilane (TEOS) as a source gas and setting the substrate temperature to 370° C. as in the case of the gate insulating film 5. However, depending on the use, it is also possible that an oxide film is formed by atmospheric CVD.

After forming the interlayer dielectric film 8, heat treatment is applied for a short period of time, that is, for example, 5 minutes at 600° C., whereby the implanted impurities (phosphorus or boron) are activated. Furthermore, by exposing the substrate to hydrogen plasma discharge, dangling bonds of the silicon thin film containing the channel region 3 are inactivated (plasma hydrogenation).

In the interlayer dielectric film 8, a plug 9a that is connected to one diffusion layer 4 is formed, and on the interlayer dielectric film 8, an interconnection layer 9 and an interconnection layer 10 are laminated. First, in the interlayer dielectric film 8, a contact hole is formed at a predetermined position by means of photolithography and etching, and thereafter, an interconnection layer 9 is formed on the interlayer dielectric film 8 so as to fill up this contact hole. Furthermore, an interconnection layer 10 is formed on the interconnection layer 9. The interconnection layer 9 is an Al film with a thickness of, for example, 500 nm, and the interconnection layer 10 is a Ti film with a thickness of, for example, 50 nm. These Al film and Ti film can be formed in order in the same sputtering apparatus without being exposed to the atmosphere in the forming process.

On the entire surface of the interlayer dielectric film 8, a silicon hydronitride ($SiN_x$:H) film 11 is formed. This silicon hydronitride film 11 is formed to a thickness of 400 nm by plasma CVD of a raw material gas mixed with hydrogen at 350° C. so as to cover the interconnection layers 9 and 10. In this embodiment, plasma hydrogenation has already been applied, however, this process can be commonly used as the plasma hydrogenation when no independent plasma hydrogenation is applied. The interconnection layer 10 improves adhesiveness between the interconnection layer 9 and the silicon hydronitride film 11.

After this process of forming the silicon hydronitride film 11, the heating temperature is controlled to 350° C. or less so that hydrogen in the polysilicon thin film is retained in the polysilicon thin film. In the silicon hydronitride film 11, a contact hole reaching the interconnection 10 is formed, and a lower electrode 12 made of ITO (indium tin oxide film) as a conductive oxide is formed on the silicon hydronitride film 11 so as to fill up this contact hole. On the lower electrode 12, a ferroelectric film 13 and an upper electrode 14 are laminated. These lower electrode 12, the ferroelectric film 13, and the upper electrode 14 form a ferroelectric capacitive element. The ferroelectric film 13 is formed of, for example, a PZT ($Pb(Zr,Ti)O_3$) film. This PZT is deposited by, for example, sputtering at room temperature, and then irradiated with an XeCi excimer laser (wavelength $\lambda$=308 nm) with an energy density of 200 mJ/cm² and a laser pulse width of 50 nsec to be crystallized. When a PZT thin film is formed, generally, a PZT thin film is formed by a sol-gel method or sputtering and then post-heated at a temperature equal to or higher than 600° C. Or, a method is employed in which a film with excellent crystals is obtained by CVD at a low temperature of approximately 450° C. (350 to 500° C.). However, as in the case of this embodiment, when sputtering is carried out at room temperature and then the XeCl excimer laser ($\lambda$=308 nm) is irradiated, the excimer laser is an ultrashort pulse laser with a pulse width of approximately 50 nsec, so that layers other than the layer absorbing the laser are not heated, so that the polysilicon thin film that has been subjected to hydrogen plasma processing can be maintained at 350° C. or less. Thereby, hydrogen in the polysilicon thin film is retained. The ferroelectric layer thus formed is patterned by photolithography and radio-frequency (RF) plasma etching.

On the ferroelectric film 13, an upper electrode 14 is provided. The upper electrode 14 is formed of, for example, a gold film. This upper electrode 14 can be made to commonly serve as an interconnection. On the silicon hydronitride film 11 including the surface of this upper electrode 14, a protective film 15 is provided so as to cover this. The protective film 15 is formed of, for example, a silicon oxynitride film.

Next, operations of the first embodiment constructed as described above are explained. In this embodiment, since the silicon hydronitride film 11 is formed by plasma CVD, in the polysilicon thin film forming the source/drain diffusion layers 4 and the channel region 3 of the thin film transistor 7 in the active element region existing below the silicon hydronitride film, Si dangling bonds are terminated and inactivated by hydrogen. Therefore, in the present invention, the channel region 3 is formed in the polysilicon thin film having Si dangling bonds inactivated by hydrogen. In the active element layer of the switching thin film transistor 7 covered by the interlayer dielectric film 8, hydrogen exists with a high concentration, and furthermore, a silicon hydronitride film 11 is provided thereon. Thereby, the Si—H bonds in the channel region 3 can be maintained stably, and the semiconductor performance is not deteriorated by contamination. In addition, oxygen and moisture, etc., can be prevented by the silicon hydronitride film 11 from entering from above the substrate, whereby the operations of the switching thin film transistor 7 become stable.

Furthermore, in this embodiment, the lower electrode 12 is formed of a conductive oxide film, so that hydrogen atoms of the silicon hydronitride film ($SiN_x$:H) 11 are prevented from diffusing in the ferroelectric film 13. Thereby, lowering of the non-dielectric constant and leak current increase due to oxygen deficiency of the ferroelectric capacitive element can be prevented. Thereby, it becomes possible to use an inexpensive substrate made of glass with a smaller content of alkali metals, quartz or a plastic material such as polycarbonate or polyimide, whereby the manufacturing cost of the semiconductor device are reduced.

Figure 5:
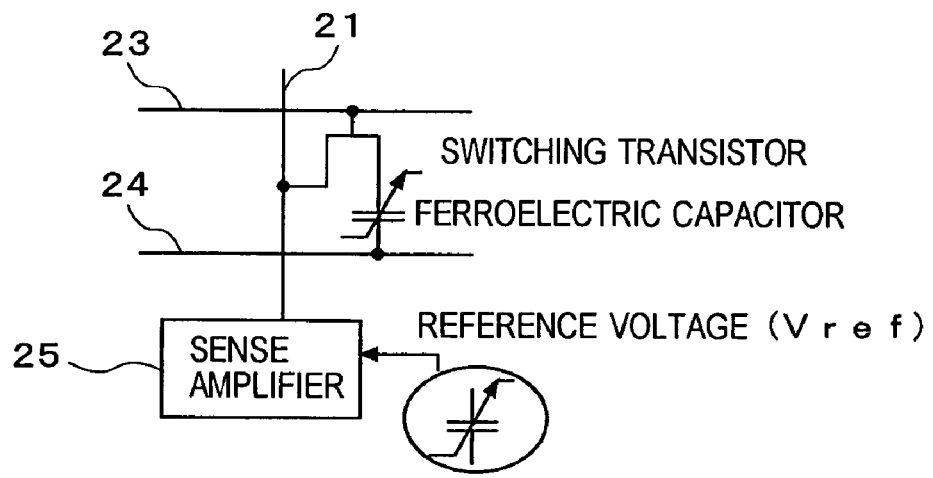
FIG. 5 is a circuit diagram showing a 1T/1C type nonvolatile memory using the semiconductor device of the embodiment of the present invention.

Next, a circuit showing a memory cell of a semiconductor nonvolatile storage device with the above-described semiconductor device installed inside is explained. FIG. 5 is a circuit diagram showing this 1T/1C memory cell. The gate 6 of the switching thin film transistor 7 shown in FIG. 1 is connected to the word line 23. In addition, the diffusion layer 4 that is not connected to the lower electrode 12 of the ferroelectric capacitive element is connected to a bit line 21. Furthermore, the upper electrode 14 of the ferroelectric capacitive element is connected to a plate line 24 that polarizes the ferroelectric film 13 by applying a voltage to the dielectric capacitor. The bit line 21 is connected to a sense amplifier 25 for amplifying a small voltage. Thus, the ferroelectric memory cell is formed by one switching thin film transistor 7 and one ferroelectric capacitive element.

In the memory cell constructed as described above, writing on the dielectric capacitor is carried out by polarizing the ferroelectric film 13 by applying a voltage to the ferroelectric capacitive element. When writing data "1", the switching thin film transistor 7 is turned on, the potential of the bit line 21 is set to a power supply voltage Vcc, and the potential of the plate line 24 is set to 0V. When writing data "0", the potential of the bit line 21 is set to 0V, and the potential of the plate line 24 is set to the power supply voltage Vcc. To carry out reading, after the voltage of the bit line 23 is charged to 0V in advance, a voltage obtained by adding a threshold voltage Vth of the switching thin film transistor 7 to the power supply voltage Vcc is applied to the word line 23, the switching thin film transistor 7 is turned on, and the potential of the plate line 24 is increased from 0 to the power supply voltage Vcc.

Then, when data "1" is written on the ferroelectric capacitive element, great charge movement moving on the hysteresis performance and involving polarization inversion occurs. Thereby, the capacitance of the bit line 21 is charged and the potential of the bit line 21 rises. The potential of the bit line 21 at this point is defined as $V_H$. On the other hand, when data "0" is written, polarization inversion does not occur, so that the charge movement is small and the increase in potential of the bit line 21 is small. The voltage of the bit line 21 at this point is defined as $V_L$. When data "1" is written on the dielectric capacitor, the data is damaged by polarization inversion after reading-out. Therefore, after reading-out, data rewriting becomes necessary. Therefore, the reference potential Vref of the sense amplifier 25 is set to a potential that is the middle of $V_H$ and $V_L$, and $V_H$ and $V_L$ are amplified to Vcc and 0V by the sense amplifier 25. Furthermore, data rewriting is carried out by lowering the potential of the plate line 24 to 0V.

Figure 6:
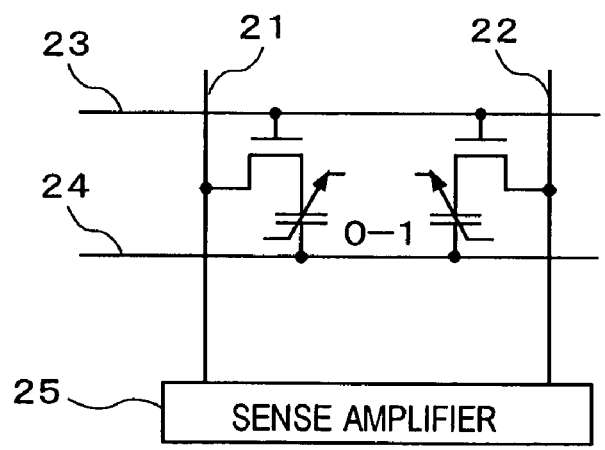
FIG. 6 is a circuit diagram showing a 2T/2C type nonvolatile memory using the semiconductor device of the embodiment of the present invention.

Next, a modified example of the memory cell of the semiconductor nonvolatile storage device including the semiconductor device of the embodiment shown in FIG. 1 is described. FIG. 6 is a circuit diagram showing this 2T/2C memory cell. The ferroelectric memory cell shown in FIG. 5 includes one switching thin film transistor 7 and one dielectric capacitive element. On the other hand, a 2T/2C ferroelectric memory cell is formed by, as shown in FIG. 6, two switching thin film transistors 7 and two ferroelectric capacitive elements. The gates of the two switching thin film transistors 7 are connected to the word line 23. The diffusion layers 4 that are not connected to the dielectric capacitor are connected to bit lines 21 and 22, respectively. Furthermore, the dielectric capacitor is connected to the plate line 24. The bit lines 21 and 22 are connected to a sense amplifier 25.

In the memory cell constructed as described above, complementary data is written on the pair of two ferroelectric capacity elements. Namely, when data "1" is written on the dielectric capacitor on the bit line 21 side, data "0" is written on the dielectric capacitor on the bit line 22 side. Namely, the dielectric capacitors disposed adjacent to each other inside one memory cell are polarized opposite each other. The sense amplifier 25 detects a signal voltage difference between the data "1" and data "0" based on polarization accumulated in the dielectric capacitor. In this case, the signal voltage difference between the data "1" and data "0" is large and is easily detected, so that the operation allowance is great. Thereby, design margins for variation in performance of the switching transistor 7 and variation in capacity of dielectric capacitor become high. Therefore, as in the present invention, a 2T/2C memory cell having wide operation margins are advantageous for the semiconductor device the manufacturing temperature of which is reduced. Other construction, operations, and effects of the memory cell shown in FIG. 6 are the same as those of the 1T/1C capacity element shown in FIG. 5.

Figure 2:
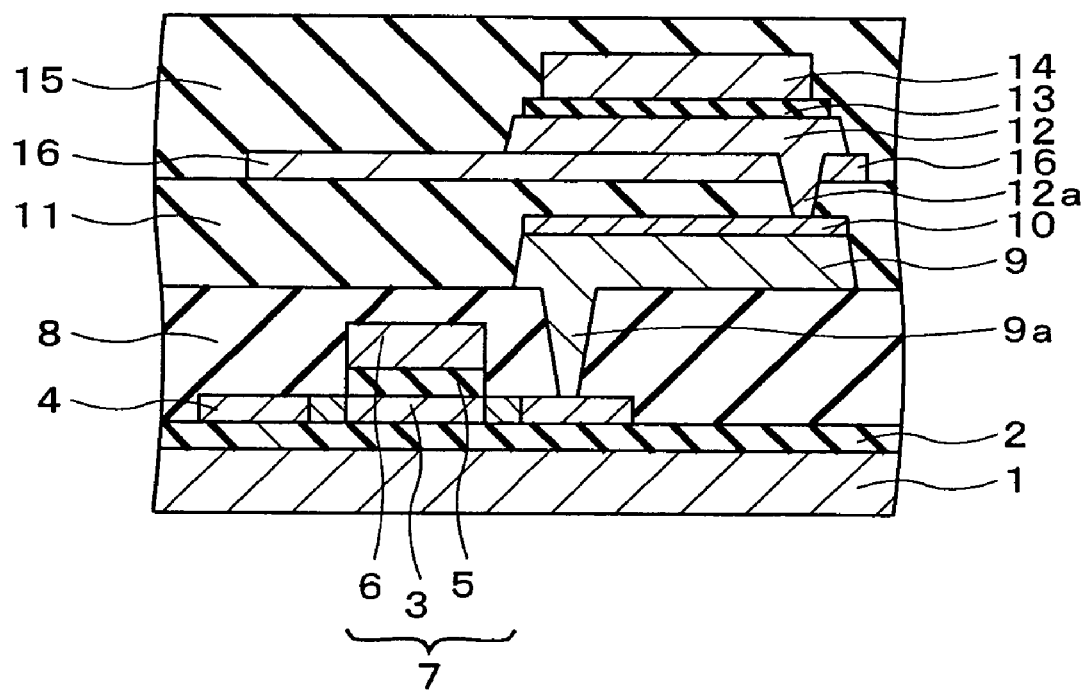
FIG. 2 is a sectional view showing a semiconductor device according to a second embodiment of the present invention.

Next, a semiconductor device according to a second embodiment of the present invention is described. FIG. 2 is a sectional view showing the structure of a semiconductor device according to the second embodiment. The second embodiment is different from the first embodiment shown in FIG. 1 in that between the active element layer including the thin film transistor 7 and the interlayer dielectric film 8 and the ferroelectric capacitive element layer including the ferroelectric capacitive element composed of the lower electrode 12, the ferroelectric film 13, and the upper electrode 14 and the protective film 15, a laminate of the silicon hydronitride film ($SiN_x$:H) 11 and the conductive oxide film 16 is formed. Namely, in FIG. 1, only the silicon hydronitride film ($SiN_x$:H) 11 is formed, however, in the second embodiment shown in FIG. 2, a laminate of the silicon hydronitride film ($SiN_x$:H) 11 and the conductive oxide layer 16 is formed by disposing the silicon hydronitride film ($SiN_x$:H) on the thin film transistor side.

In this embodiment, since the conductive oxide film 16 exists between the silicon hydronitride film (plasma CVD-$SiN_x$:H layer) 11 and the ferroelectric film 13, so that hydrogen atoms contained in the silicon hydronitride film 11 are prevented from diffusing in the ferroelectric film 13, and problems such as oxygen deficiency caused by hydrogen as a reductant can be prevented. Therefore, the use of the conductive oxide film for the lower electrode 12 as in the case of the first embodiment shown in FIG. 1 is not necessary.

Figure 3:
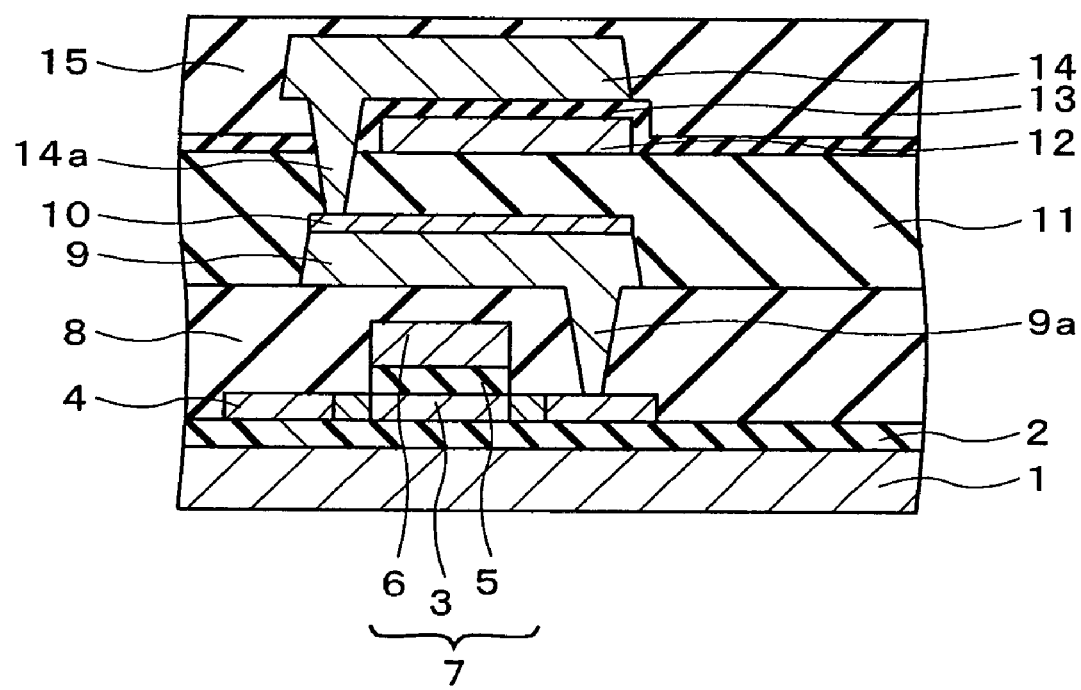
FIG. 3 is a sectional view showing a semiconductor device according to a third embodiment of the present invention.

Next, a third embodiment of the present invention is described with reference to FIG. 3. In the first embodiment, as shown in FIG. 1, the lower electrode 12 and the interconnection 10 are electrically connected to each other via a contact hole. On the other hand, in this embodiment, as shown in FIG. 3, the upper electrode 14 is connected to the interconnection 10. Namely, the ferroelectric film 13 is provided so as to cover the silicon hydronitride film 11 and the lower electrode 12, and in the silicon hydronitride film 11 and the ferroelectric film 13, a contact hole reaching the interconnection 10 is formed. The upper electrode 14 is formed on the ferroelectric film 13, and when forming this upper electrode 14, the material thereof fills up the contact hole, whereby a contact 14a that connects the interconnection 10 and the upper electrode 14 is formed. The semiconductor device of this third embodiment has the same construction as that of the semiconductor device of the first embodiment except that the lower electrode 12 is connected to the plate line, and has the same operations and effects.

Figure 4:
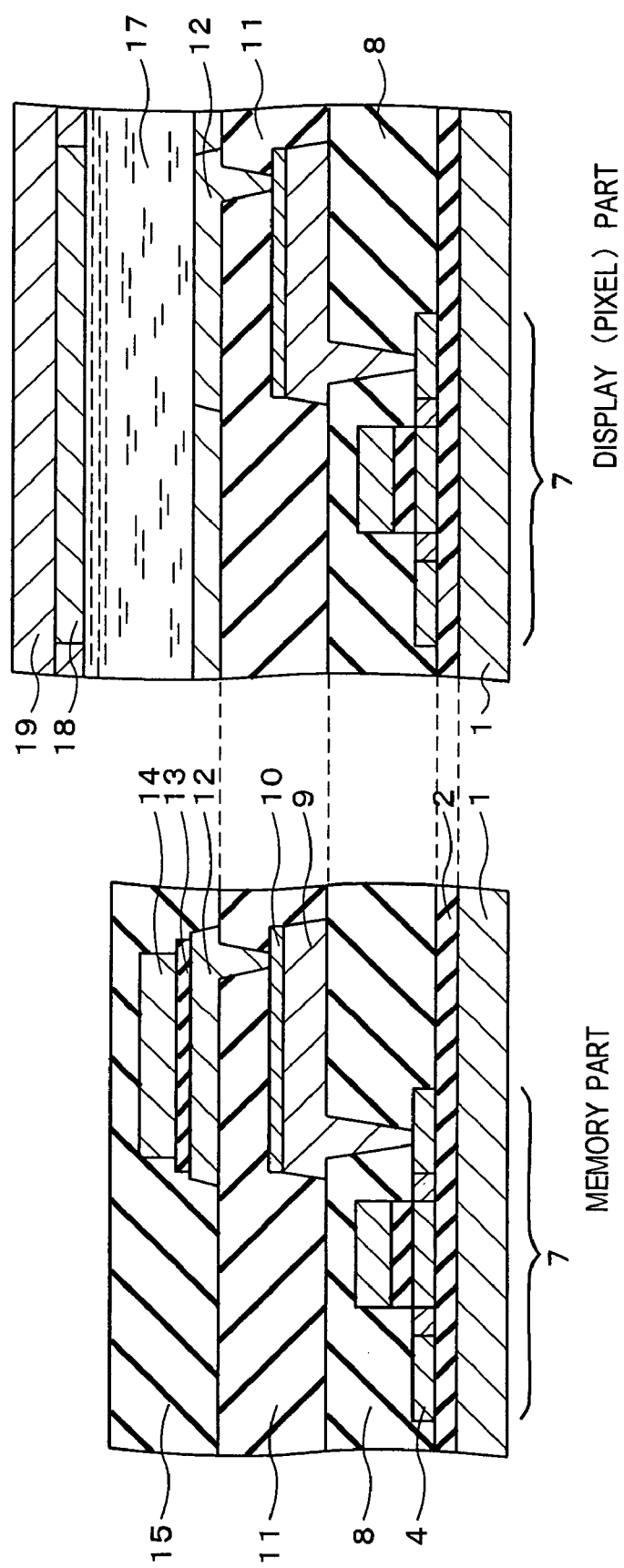
FIG. 4 is a sectional view showing a semiconductor device according to a fourth embodiment of the present invention.

Next, a fourth embodiment of the present invention is described. FIG. 4 is a sectional view showing a semiconductor device of this fourth embodiment. According to this embodiment, ITO is used for the lower electrode, and the ferroelectric capacitive element (memory part) and the liquid crystal display unit (display pixel part) are integrally formed on the same insulating substrate 1. Up to the process of forming the lower electrode 12 from ITO as a transparent electrode, the same processes as in FIG. 1 and FIGS. 7 and 8 can be applied. In the display pixel part, the ferroelectric film 13 and the upper electrode 14 are prevented from being formed on the lower electrode 12, the lower electrode 12 made of ITO remains, and between an opposed electrode 18 made of ITO formed on an opposed substrate 19 and a lower electrode 12 of the display pixel part, liquid crystal 17 is sealed. Thereby, a ferroelectric memory and a liquid crystal display part can be formed on the same substrate. Therefore, the manufacturing cost of the liquid crystal panel can be reduced.

It is also possible that an organic oriented film (not shown) that was subjected to rubbing is provided between the lower electrode 12 and the liquid crystal 17 of the liquid crystal display part. Rubbing is a method for forming fine grooves by rubbing the surface in one direction with a roll with rayon fibers. It is also possible that orientation processing is applied by forming fine grooves by ion beams or a laser on the surface of the lower electrode 12. Thereby, liquid crystal molecules on the lower electrode 12 can be oriented in the direction of the fine grooves.

Figure 7:
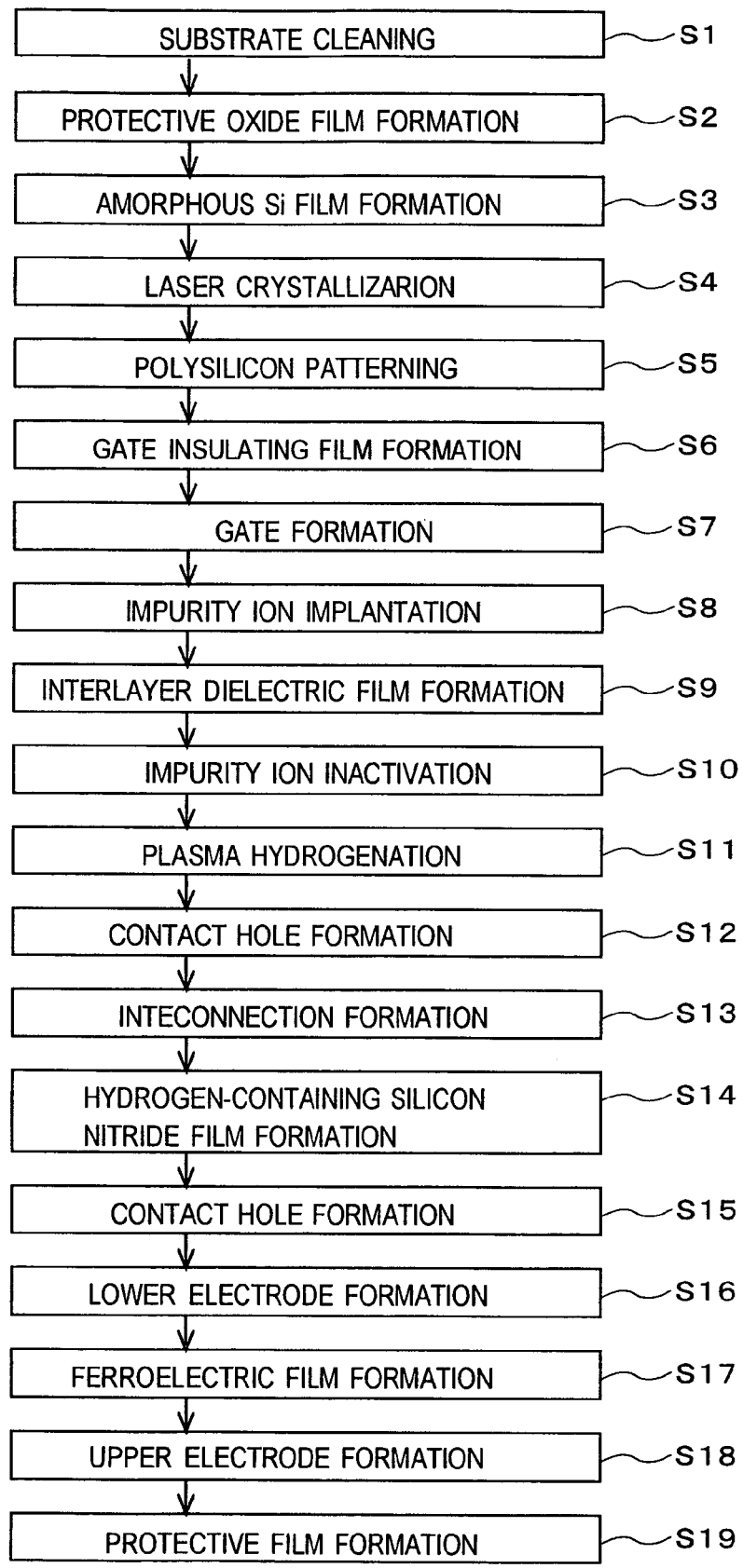
FIG. 7 is a flowchart showing a manufacturing method of the semiconductor device of the embodiment of the present invention.

Next, a manufacturing method for the semiconductor device (fourth embodiment) of the present invention is described. FIG. 7 is a flowchart showing a method for manufacturing the semiconductor device of FIG. 1 in order of steps. First, the substrate 1 is cleaned (Step S1) and a protective oxide film 2 is formed on the cleaned substrate 1 (Step S2). The thickness of the substrate 1 is, for example, 0.1 to 1.5 mm. The substrate 1 is formed from glass with a smaller content of alkali metals, quartz, or a plastic material such as polycarbonate or polyimide, and formed by, for example, non-alkali glass (OA-10 made by Nippon Electric Glass Co., Ltd.). The film thickness of the protective oxide film 2 is, for example, 300 nm.

Next, an amorphous silicon film is formed on the protective oxide film 2 (Step S3). The amorphous silicon film is formed by, for example, CVD. This amorphous silicon film is formed as a polysilicon film by removing hydrogen atoms by being, for example, annealed and made polycrystal by the excimer laser (Step S4). The irradiation intensity of the excimer laser is, for example, 300 to 500 mJ/cm2, and this is a condition for obtaining an average crystal grain size of 200 nm of polysilicon. By the irradiation intensity of 300 to 500 mJ/cm$^2$, polysilicon with an average crystal grain size of 20 nm to 2 μm is obtained. Next, the polysilicon film is patterned by using photolithography and dry-etching (Step S5).

Next, a gate insulating film 5 is formed on the polysilicon film (Step S6). The gate insulating film 5 is formed by, for example, plasma CVD in oxygen-mixed plasma by using tetraethoxysilane (TEOS) as a raw material gas. During deposition, the substrate temperature is set to, for example, 370° C., and the film thickness is, for example, 50 nm.

Next, a gate 6 is formed (Step S6). The gate 6 is formed by forming, for example, a polysilicon film gas-doped with phosphorus by plasma CVD and sputtering a chromium film thereon. The film thickness of this polysilicon film is, for example, 100 nm, and the film thickness of the chromium film is, for example, 200 nm. This polysilicon/chromium laminated film is patterned by photolithography and etching to form a gate electrode. The gate length and the channel length are, for example, 1 micrometer.

Next, diffusion layers 4 are formed by implanting impurity ions in the polysilicon film in a self-aligning manner by using the gate 6 as a mask (Step S8). The impurity ions are, for example, phosphorus or boron. A portion with no impurity ions implanted under the gate 6 becomes a channel film 3. A switching transistor 7 is thus formed.

Next, on the protective oxide film 2, an interlayer dielectric film 8 is formed so as to cover the thin film transistor part 7 and the protective oxide film 2 (Step S9). For the interlayer dielectric film 8, for example, a silicon oxide film is used. The interlayer dielectric film 8 is formed by, for example, plasma CVD or atmospheric CVD in oxygen-mixed plasma by using, for example, tetraethoxysilane (TEOS) as a raw material gas. During deposition, the substrate temperature is set to, for example, 370° C. and the film thickness is set to, for example, 400 nm. Next, impurity ions in the diffusion layer 4 are activated by heat treatment (Step S10). The heat treatment temperature is, for example, 600° C., and the heat treatment period is, for example, 5 minutes.

Next, Si—H bonds are formed by reacting Si dangling bonds contained in the channel film 3 with hydrogen by hydrogen plasma processing to inactivate the Si dangling bonds (Step S11). Next, the interlayer dielectric film 8 is partially removed by photolithography and etching to form, in the interlayer dielectric film 8, a contact hole that partially opens the surface of one of the two diffusion layers 4 (Step S12). Next, an interconnection 9 is formed so as to fill up this contact hole and cover the surface of the interlayer dielectric film 8, and an interconnection 10 is formed on the interconnection 9 (Step S13). The interconnections 9 and 10 are made of, for example, aluminum and titanium, respectively, and are continuously formed by, for example, sputtering. The film thicknesses of the interconnections 9 and 10 are 500 nm and 50 nm, respectively. Thereafter, the aluminum film and the titanium film are etched by photolithography and etching to form the interconnections 9 and 10.

Next, on the interlayer dielectric film 8, a silicon hydronitride film 11 is formed so as to cover the side surface of the interconnection 9 and the interconnection 10 (Step S14). The silicon hydronitride film 11 is formed by plasma CVD using a hydrogen-mixed raw material gas. The film thickness of the silicon hydronitride film 11 is, for example, 400 nm. In the steps after this step, for example, the temperature of the switching transistor 7 is set to be equal to or lower than 350° C. If the temperature of the switching transistor 7 becomes higher than 350° C., this poses a problem in that Si—H bonds formed in the channel film 3 by the above-described hydrogen plasma processing are cut, and Si dangling bonds are formed again.

Next, the silicon hydronitride film 11 is partially removed by photolithography and etching to form a contact hole that partially opens the surface of the interconnection 10 in the silicon hydronitride film 11 (Step S15). Next, a lower electrode 9 is formed so as to fill up this contact hole and cover the surface of the silicon hydronitride film 11 (Step S16). The lower electrode 12 is formed of, for example, an ITO film by, for example, sputtering, and patterned by photolithography and etching.

Next, a ferroelectric film 13 is formed on the lower electrode 12 (Step S17). The ferroelectric film 13 is made of, for example, PZT, and is formed by, for example, sputtering by setting the substrate temperature to a room temperature, and crystallized by being irradiated with an excimer laser. This excimer laser is, for example, an XeCl excimer laser. The conditions of laser irradiation are, for example, an energy density of 200 mJ/cm$^2$ and a laser pulse width of 50 nsec. After laser irradiation, patterning is carried out by photolithography and etching to form the ferroelectric film 13. This etching is, for example, dry-etching using high frequency plasma.

Next, an upper electrode 14 is formed on the ferroelectric film 13 (Step S18). The upper electrode 14 is formed of, for example, a gold film by, for example, sputtering, and is patterned by photolithography and etching. Next, on the silicon hydronitride film 11, a protective film 15 is formed so as to cover the surface of the silicon hydronitride film 11, the lower electrode, the side surface of the ferroelectric film 13, and the upper electrode (Step S19). The protective film 15 is formed of, for example, a silicon oxynitride film by, for example, CVD.

In the semiconductor manufacturing method of this embodiment thus constituted, by hydrogen plasma processing, Si dangling bonds of the channel film 3 can be inactivated by being bonded to hydrogen. In addition, by this hydrogen plasma processing, the hydrogen concentration in the active element region of the switching transistor 7 covered by the interlayer dielectric film 8 can be increased, and the silicon hydronitride film 11 is formed thereon, whereby Si—H bonds of the channel film 3 become stable. Furthermore, in the step of forming the ferroelectric film 13 after the step of hydrogen plasma processing, the ferroelectric film 13 is crystallized by excimer laser irradiation, so that the channel film 3 containing Si—H bonds does not reach a temperature exceeding 350° C. Thereby, it is prevented that Si—H bonds are cut and Si dangling bonds are generated, whereby the ferroelectric film 13 with desired dielectric performance can be formed.

Figure 8:
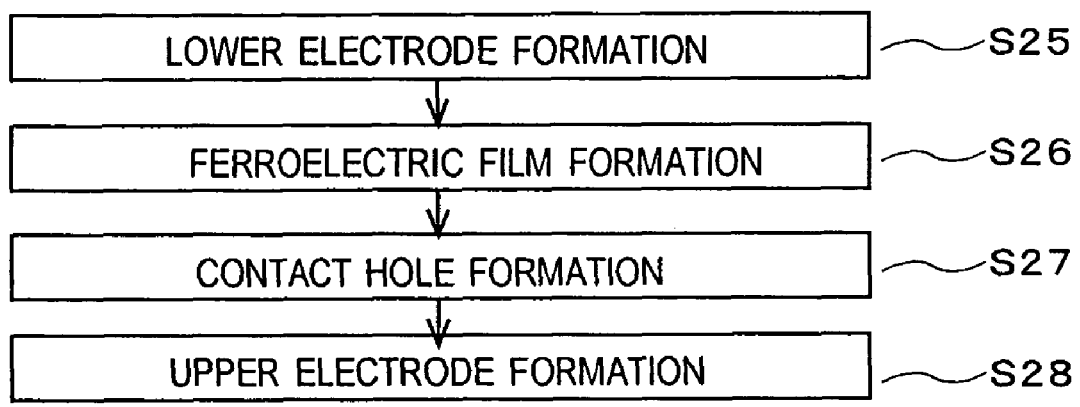
FIG. 8 is a flowchart showing another manufacturing method of the semiconductor device of the embodiment of the present invention.

Next, another embodiment of the semiconductor device manufacturing method of this invention is described. FIG. 8 is a flowchart showing a part of steps of this semiconductor device manufacturing method. In the embodiment shown in FIG. 7, after forming a silicon hydronitride film 11 in Step S14, a contact hole is formed in the silicon hydronitride film 11 in Steps 15 through 18, and the lower electrode 12, the ferroelectric film 13, and the upper electrode 14 are formed. On the other hand, in the semiconductor device manufacturing method of FIG. 8, instead of Steps 15 through 18 of FIG. 7, a lower electrode 12 is formed first (Step S25), and then a ferroelectric film 13 is formed so as to cover the lower electrode 12 and the silicon hydronitride film 11 (Step S26).

Next, a contact hole that partially opens the surface of the interconnection 10 is formed in the silicon hydronitride film 11 and the ferroelectric film 13 by partially removing the silicon hydronitride film 11 and the ferroelectric film 13 by photolithography and etching (Step S27). The method of forming the contact hole in the silicon hydronitride film 11 is the same as in FIG. 7. In the ferroelectric film 13, the same method as the patterning method used in Step S17 of FIG. 7 is used. Next, an upper electrode 14 is formed so as to fill up this contact hole and cover the surface of the ferroelectric film 13 (Step S28). The forming method for these lower electrode 12, ferroelectric film 13, and upper electrode 14 and the patterning method for the lower electrode 12 and the upper electrode 14 are the same as those of FIG. 7.

Figure 9:
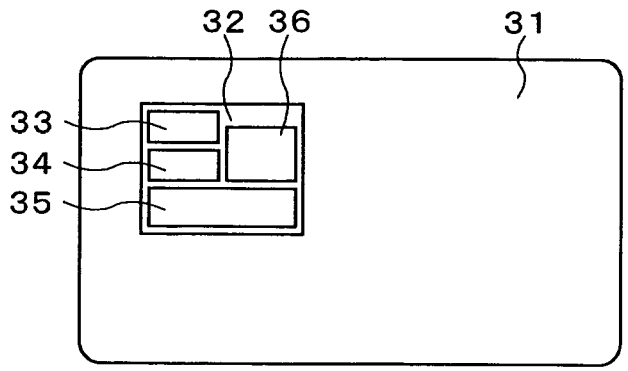
FIG. 9 is a schematic view showing an IC card using the semiconductor device of the embodiment of the present invention.

Next, an embodiment of an electronic device to which the semiconductor nonvolatile storage device of this invention is applied is explained. FIG. 9 is an example of an application to an IC card. On a substrate 31 that has the card entire shape, a substrate 32 on which a chip is mounted is provided. The substrate 31 is made of, for example, plastic or the like. On the substrate 32, a ROM 33 storing data, an RF/IF (radio frequency interface) 34 for data exchange with the exterior, and a CPU (central processing unit) 35 for data operation are provided. In addition, a nonvolatile memory 36 for storing data received by the RF/IF or data outputted as a result of operation of the CPU is provided on the substrate 32. These ROM 33, RF/IF 34, CPU 35, and nonvolatile memory 36 are formed on the same substrate 32 by the above-described semiconductor device manufacturing method. Namely, for the ROM 33, the RF/IF 34, the CPU 35, and the nonvolatile memory 36, an inexpensive substrate made of glass with a smaller content of alkali metals, quartz, or a plastic material such as polycarbonate or polyimide can be used, whereby the manufacturing costs of the semiconductor device can be reduced. This IC card uses the nonvolatile memory of the present invention in place of a conventional EEPROM, and in comparison with an IC card using an EEPROM, the writing speed, writing power consumption, and maximum number of rewriting times can be improved. The semiconductor device thus constructed is used as an IC card such as an ID card, financial card, or traffic card.

Figure 10:
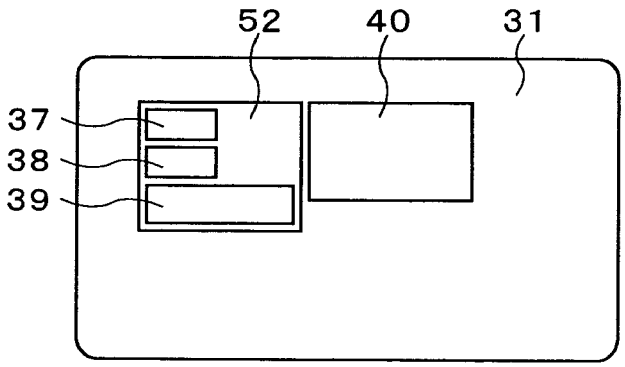
FIG. 10 is a schematic view showing another IC card using the semiconductor device of the embodiment of the present invention.

FIG. 10 shows another IC card using the nonvolatile memory of the present invention. In the IC card of FIG. 10, the ROM 37, the RF/IF 39, and the CPU 40 are formed by mounting an IC chip obtained through an LSI process on a single crystal silicon substrate 52, and the nonvolatile memory 40 is formed on a glass substrate by the method shown in FIG. 1, FIG. 7, and FIG. 8. In comparison with an IC card using an EEPROM, in this IC card, the writing speed, writing power consumption, and the maximum number of rewriting times can also be improved, and furthermore, its manufacturing costs are also reduced more than the costs of conventional IC cards.

Figure 11:
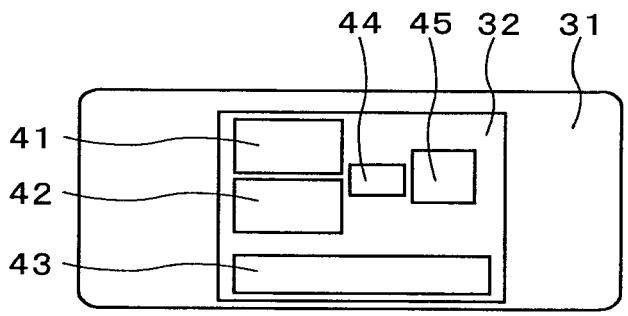
FIG. 11 is a schematic view showing an RF-ID tag using the semiconductor device of the embodiment of the present invention.

Next, an embodiment in which the semiconductor device of this invention is applied to a radio-frequency ID tag is explained. FIG. 11 is a schematic view showing this radio-frequency ID tag. On a substrate 31 that has the shape of the tag, a substrate 32 is provided. This substrate 32 is an inexpensive substrate made of glass with a smaller content of alkali metals, quartz, or a plastic material such as polycarbonate or polyimide. On this substrate 32, in the process of the thin film transistor process including the memory of the present invention, a received data decoder circuit 41, a transmission data encoder circuit 42, an antenna element 43 for data exchange with the exterior, a nonvolatile memory 45 for storing data according to this embodiment, and a control circuit 44 for controlling operations of these are integrally provided. By thus using the nonvolatile memory of this invention, the manufacturing cost of the RF-ID tag can be reduced. In addition, in comparison with conventional RF-ID tags using an EEPROM, the writing speed, writing power consumption, and the maximum number of rewriting times are improved.

Figure 12:
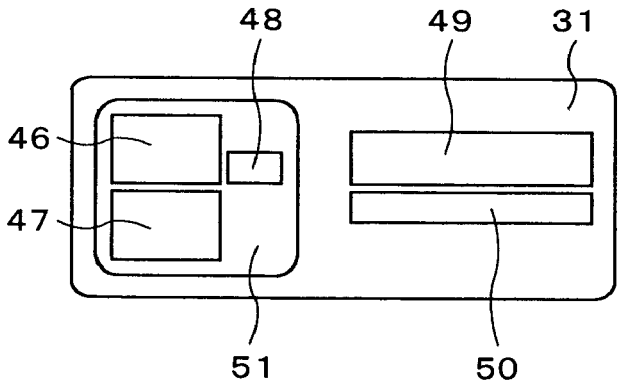
FIG. 12 is a schematic view showing another RF-ID tag using the semiconductor device of the embodiment of the present invention.
Figure 13:
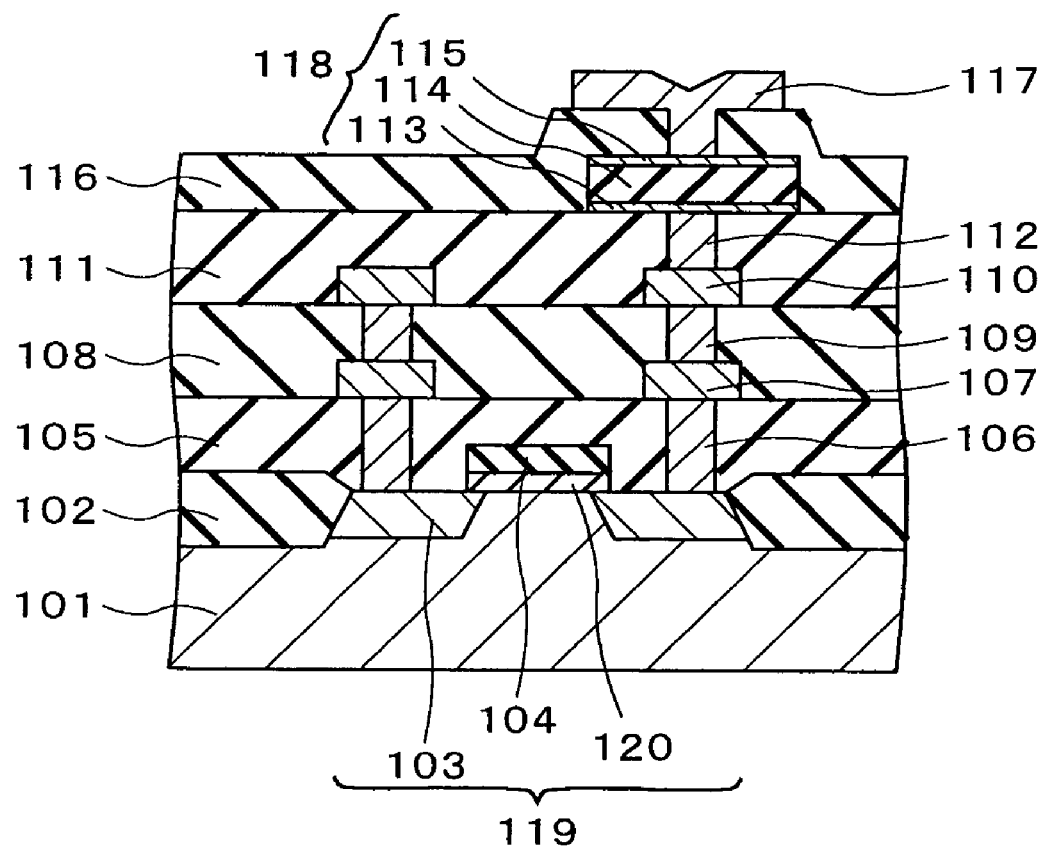
FIG. 13 is a sectional view showing a conventional semiconductor device.

Next, another radio-frequency ID tag using the semiconductor device of the present invention is explained with reference to FIG. 12. In this radio-frequency ID tag, on a substrate 31, an IC chip formed through the normal LSI process on a single crystal silicon substrate 48, a nonvolatile memory 49 formed by the method of this invention on an inexpensive substrate made of glass with a smaller content of alkali metals, quartz, or a plastic material such as polycarbonate or polyimide, and an antenna element 50 are provided. The IC chip has a received data decoder circuit 46, a transmission data encoder circuit 47, and a control element 48 formed on a single crystal silicon substrate 48. In this embodiment, the manufacturing cost can also be reduced more than conventional RF-ID tags using EEPROM. In addition, in comparison with conventional RF-ID tags using an EEPROM, the writing speed, writing power consumption, and the maximum number of rewriting times are improved

What is claimed is:

1. A semiconductor device comprising:
an insulating substrate;
an active element formed in an active element layer disposed above this insulating substrate;
a ferroelectric capacitive element formed in a ferroelectric capacitive element layer disposed above the active element layer; and
a silicon hydronitride layer formed between the active element layer and the ferroelectric capacitive element layer,
wherein the active element includes a thin film transistor having a polysilicon thin film having source/drain regions and a channel region, a gate electrode formed above the channel region, and a gate insulating film formed between the polysilicon thin film and the gate electrode,
the active element layer has an interlayer dielectric film which covers the polysilicon thin film and includes the gate electrode embedded,
the ferroelectric capacitive element is formed by laminating a lower electrode, a ferroelectric layer, and an upper electrode,
a hydrogen concentration of the active element layer is higher than a hydrogen concentration of the ferroelectric capacitive element, and
wherein the semiconductor device further comprises a protective oxide film between at least one of the source region, the drain region, the interlayer dielectric film, and the channel region, and the insulating substrate, wherein the channel region comprises a plurality of Si—H bonds.

2. A semiconductor device comprising:
an insulating substrate;
an active element formed in an active element layer disposed above the insulating substrate;
a ferroelectric capacitive element formed in a ferroelectric capacitive element layer disposed above the active element layer;
a silicon hydronitride layer formed between the active element layer and the ferroelectric capacitive element; and
a conductive oxide layer formed between this silicon hydronitride layer and the ferroelectric capacitive element layer,
wherein the active element includes a thin film transistor having a polysilicon thin film that has source/drain regions and a channel region, a gate electrode formed above the channel region, and a gate insulating film formed between the polysilicon thin film and the gate electrode,
the active element layer has an interlayer dielectric film that covers the polysilicon thin film and includes the gate electrode embedded therein,
the ferroelectric capacitive element comprises a laminate of a lower electrode, a ferroelectric layer, and an upper electrode, and a hydrogen concentration of the active element layer is higher than that of the ferroelectric capacitive element layer, and an oxygen concentration of the ferroelectric capacitive element layer is higher than that of the active element layer.

3. The semiconductor device according to claim 1, wherein a connecting part is provided which connects the active element and the ferroelectric capacitive element by being inserted through the silicon hydronitride layer.

4. The semiconductor device according to claim 2, wherein a connecting part is provided which connects the active element and the ferroelectric capacitive element by being inserted through the silicon hydronitride layer.

5. The semiconductor device according to claim 1, wherein the lower electrode is formed from a conductive oxide.

6. The semiconductor device according to claim 2, wherein the lower electrode is formed from a conductive oxide.

7. The semiconductor device according to claim 2, wherein the conductive oxide comprises indium tin oxide.

8. The semiconductor device according to claim 1, wherein the silicon hydronitride layer is formed by plasma CVD (Chemical Vapor Deposition).

9. The semiconductor device according to claim 2, wherein the silicon hydronitride layer is formed by plasma CVD (Chemical Vapor Deposition).

10. The semiconductor device according to claim 3, wherein the connecting part has an interconnection formed in the silicon hydronitride layer, a first via hole that penetrates the silicon hydronitride layer and connects the lower electrode and the interconnection, and a second via hole that penetrates the interlayer dielectric film and connects the source/drain regions and the interconnection.

11. The semiconductor device according to claim 4, wherein the connecting part has an interconnection formed in the silicon hydronitride layer, a first via hole that penetrates the silicon hydronitride layer and connects the lower electrode and the interconnection, and a second via hole that penetrates the interlayer dielectric film and connects the source/drain regions and the interconnection.

12. The semiconductor device according to claim 3, wherein the connecting part has an interconnection formed in the silicon hydronitride layer, a first via hole that penetrates the silicon hydronitride layer and connects the upper electrode and the interconnection, and a second via hole that penetrates the interlayer dielectric film and connects the source/drain regions and the interconnection.

13. The semiconductor device according to claim 4, wherein the connecting part has an interconnection formed in the silicon hydronitride layer, a first via hole that penetrates the silicon hydronitride layer and connects the upper electrode and the interconnection, and a second via hole that penetrates the interlayer dielectric film and connects the source/drain regions and the interconnection.

14. The semiconductor device according to claim 12, wherein the ferroelectric film is formed on the silicon hydronitride layer so as to cover the lower electrode, and the first via hole penetrates an opening formed in the ferroelectric film.

15. The semiconductor device according to claim 13, wherein the ferroelectric film is formed on the silicon hydronitride layer so as to cover the lower electrode, and the first via hole penetrates an opening formed in the ferroelectric film.

16. The semiconductor device according to claim 1, which comprises a nonvolatile memory that uses the active element as a switching element and the ferroelectric capacitive element as a capacitive part.

17. The semiconductor device according to claim 2, which comprises a nonvolatile memory that uses the active element as a switching element and the ferroelectric capacitive element as a capacitive part.

18. An electronic device, using the semiconductor device according to claim 1.

19. An electronic device, using the semiconductor device according to claim 2.

20. An electronic device, which comprises an IC card using the nonvolatile memory according to claim 16.

21. An electronic device, which comprises an IC card using the nonvolatile memory according to claim 17.

22. The electronic device according to claim 20, wherein the nonvolatile memory is integrally formed together with a central processing unit (CPU), a radio-frequency (RF) interface part for data exchange with the exterior, and a read-only memory (ROM) for storing data, on a same substrate.

23. The electronic device according to claim 21, wherein the nonvolatile memory is integrally formed together with a central processing unit (CPU), a radio-frequency (RF) interface part for data exchange with the exterior, and a read-only memory (ROM) for storing data, on a same substrate.

24. The electronic device according to claim 20, wherein a central processing unit (CPU), a radio-frequency (RF) interface for data exchange with the exterior, and a read-only memory (ROM) for storing data are formed on a single crystal substrate separately from the nonvolatile memory.

25. The electronic device according to claim 21, wherein a central processing unit (CPU), a radio-frequency (RF) interface for data exchange with the exterior, and a read-only memory (ROM) for storing data are formed on a single crystal substrate separately from the nonvolatile memory.

26. The electronic device, comprising:
a liquid crystal display unit,
wherein a pixel circuit of the liquid crystal display unit is formed on the insulating substrate of the semiconductor device according to claim 7,
a pixel electrode connected to a transistor of the pixel circuit is formed on a silicon hydronitride layer that comprises a same layer as the silicon hydronitride film of the semiconductor device, and comprises an indium tin oxide layer that comprises a same layer as the indium tin oxide layer forming the lower electrode of the semiconductor device.

27. A semiconductor device comprising:
a glass substrate;
an active element formed in an active element layer disposed above this glass substrate;
a ferroelectric capacitive element formed in a ferroelectric capacitive element layer disposed above the active element layer; and
a silicon hydronitride layer formed between the active element layer and the ferroelectric capacitive element layer,
wherein the active element includes a thin film transistor having a polysilicon thin film comprising Si—H bonds having source/drain regions and a channel region, a gate electrode formed above the channel region, and a gate insulating film formed between the polysilicon thin film and the gate electrode,
the active element layer has an interlayer dielectric film which covers the polysilicon thin film and includes the gate electrode embedded,
the ferroelectric capacitive element is formed by laminating a lower electrode, a ferroelectric layer, and an upper electrode, awl a hydrogen concentration of the active element layer is higher than a hydrogen concentration of the ferroelectric capacitive element, and wherein the semiconductor device further comprises a protective oxide film between at least one of the source region, the drain region, the interlayer dielectric film, and the channel region, and the glass substrate, wherein the channel region comprises a plurality of Si—H bonds.

* * * * *